United States Patent
Albers

(10) Patent No.: US 11,104,986 B2
(45) Date of Patent: Aug. 31, 2021

(54) METAL CUTTING TOOL WITH MULTI-LAYER COATING

(71) Applicant: WALTER AG, Tubingen (DE)

(72) Inventor: Ulrich Albers, Starzach-Borstingen (DE)

(73) Assignee: WALTER AG, Tubingen (DE)

( * ) Notice: Subject to any disclaimer, the term of this patent is extended or adjusted under 35 U.S.C. 154(b) by 121 days.

(21) Appl. No.: 16/614,408

(22) PCT Filed: May 15, 2018

(86) PCT No.: PCT/EP2018/062599
§ 371 (c)(1),
(2) Date: Nov. 18, 2019

(87) PCT Pub. No.: WO2018/210866
PCT Pub. Date: Nov. 22, 2018

(65) Prior Publication Data
US 2020/0181756 A1 Jun. 11, 2020

(30) Foreign Application Priority Data
May 19, 2017 (EP) ..................................... 17000890

(51) Int. Cl.
C23C 14/06 (2006.01)
B23C 5/16 (2006.01)
C23C 14/02 (2006.01)
C23C 14/32 (2006.01)

(52) U.S. Cl.
CPC ............ C23C 14/0641 (2013.01); B23C 5/16 (2013.01); C23C 14/022 (2013.01);
(Continued)

(58) Field of Classification Search
CPC ......... B23B 27/14; B23B 27/148; B23C 5/16; C23C 14/0641; C23C 28/044; C23C 28/42
(Continued)

(56) References Cited

U.S. PATENT DOCUMENTS

2013/0065081 A1* 3/2013 Ni ........................ C23C 14/0641
428/660
2015/0211105 A1* 7/2015 Schier .................. C23C 14/0641
428/216
(Continued)

FOREIGN PATENT DOCUMENTS

EP 2880199 A1 6/2015
JP 2003170303 A 6/2003
(Continued)

OTHER PUBLICATIONS

L. Jakab-Farkas: "Preparation and characterization of (Ti, Al, Si)N coating developed by d.c. reactive magnetron sputtering", Journal of Optoelectronics and Advanced Materials, vol. 15, No. 7-8, Aug. 31, 2013, pp. 696-702.

*Primary Examiner* — Archene A Turner
(74) *Attorney, Agent, or Firm* — Corinne R. Gorski

(57) ABSTRACT

A metal cutting tool includes a main body made of cemented carbide, cermet, ceramic, steel or high-speed steel, and a multi-layer wear protection coating. The wear protection coating includes a lower layer having an overall composition of $Ti_m Al_{(1-m)} N$ with $0.25 < m < 0.55$ and an overall thickness of 500 nm to 3 μm. The lower layer has 50 to 600 pairs of alternately stacked sub-layers in a sequence (A-B-A-B- . . . ) and having a composition $Ti_a Al_{(1-a)} N$ with $0.45 \leq a \leq 0.55$ and a thickness of 1 nm to 10 nm. The upper layer has 30 to 400 triples of alternately stacked sub-layers in a sequence (C-D-E-C-D-E- . . . ). The sub-layers of the
(Continued)

upper layer have a composition $Ti_x Al_y Si_z N$ with $x+y+z=1$ and $0.20 \leq x \leq 0.45$, $0.20 \leq y \leq 0.45$ and $0.20 \leq z \leq 0.45$ and a thickness of 1 nm to 10 nm.

11 Claims, 3 Drawing Sheets

(52) U.S. Cl.
CPC .......... *C23C 14/024* (2013.01); *C23C 14/325* (2013.01); *B23C 2228/10* (2013.01)

(58) Field of Classification Search
USPC .......... 51/307, 309; 428/216, 325, 336, 697, 428/698, 699
See application file for complete search history.

(56) References Cited

U.S. PATENT DOCUMENTS

| | | | |
|---|---|---|---|
| 2016/0047031 A1* | 2/2016 | Okamura | ................ C04B 41/52 428/216 |
| 2016/0175939 A1 | 6/2016 | Tanaka et al. | |
| 2016/0193662 A1 | 7/2016 | Park et al. | |

FOREIGN PATENT DOCUMENTS

| | | | |
|---|---|---|---|
| JP | 2003-334704 | * | 11/2003 |
| JP | 2007105839 A | | 4/2007 |
| JP | 2010-099769 | * | 5/2010 |
| JP | 2010-188461 | * | 9/2010 |

* cited by examiner (VB1) uniform flank wear (VB2) non-uniform flank wear (VB3) localized flank wear

METAL CUTTING TOOL WITH MULTI-LAYER COATING

RELATED APPLICATION DATA

This application is a § 371 National Stage Application of PCT International Application No. PCT/EP2018/062599 filed May 15, 2018 claiming priority to EP 17000890.8 filed May 19, 2017.

FIELD OF THE INVENTION

The invention relates to a metal cutting tool comprising a main body made of cemented carbide, cermet, ceramic, steel or high-speed steel, and a multi-layer wear protection coating which is applied on the main body preferably by the PVD process. The metal cutting tool of the present invention is particularly suitable for the machining of super alloys, and it exhibits improved tool life and resistance against diffusion wear at high cutting temperatures.

BACKGROUND OF THE INVENTION

Heat resistant super alloys (HRSA) and titanium, including titanium alloys, of the ISO-S group of materials exhibit excellent mechanical strength and resistance to creep (tendency for solids to slowly move or deform under stress) at high temperatures, good surface stability, and corrosion and oxidation resistance. Due to their superior properties, these materials are, for example, used for the manufacturing of aerospace engine and power gas turbines in the combustion and turbine sections, applications in the oil and gas industries, marine applications, medical joint implants, high corrosion resistant applications, etc. Titanium can be used under very harsh environments, which could cause considerable corrosion attacks on most other construction materials. This is due to the titanium oxide, $TiO_2$, which is very resistant and covers the surface in a layer which is approx. 0.01 mm thick. If the oxide layer is damaged and there is oxygen available, the titanium rebuilds the oxide immediately. Titanium is, for example, particularly suitable for heat exchangers, de-salting equipment, jet engine parts, landing gears, structural parts in aerospace frame, etc.

However, the machinability of both HRSA and titanium is poor, especially in age-hardened conditions, which impose particular demands on the cutting tools.

Machinability of HRSA-materials increases in difficulty according to the following sequence: iron based materials, nickel based materials and cobalt based materials. All the materials have high strength at high temperatures and produce segmented chips during cutting which create high and dynamic cutting forces. Poor heat conductivity and high hardness generate high temperatures in the tool during machining. The high strength, work hardening and adhesion hardening properties create notch wear at maximum depth of cut and an extremely abrasive environment for the cutting edge. Carbide grade cutting tools should have high edge toughness and adhesion of the coating to the substrate to provide good resistance to plastic deformation and coating delamination (flaking).

Titanium and titanium alloys have poor thermal conductivity, and strength is retained at high temperatures, which generates high cutting forces and heat at the cutting edge. Highly-sheared, thin chips with a tendency for galling create a narrow contact area on the rake face generating concentrated cutting forces close to the cutting edge. A cutting speed that is too high produces a chemical reaction between the chip and the cutting tool material, which can result in sudden insert chipping and breakage. Therefore, cutting tool materials should have good hot hardness and should not (or only slowly) react with the titanium.

Fine-grained, uncoated carbide is often used for the machining of HRSA and titanium work piece materials. However, due to the high temperatures at the cutting edge and the affinity of HRSA and titanium for carbon and cobalt result in high diffusion wear even at relatively low cutting speeds. The improvement in productivity and tool life in machining HRSA materials and titanium by PVD or CVD coatings is rather limited to what is known from tools for machining steel or cast iron. There are cases known where a coated tool even performs less in terms of tool life than the same tool uncoated. This effect is assumed to be related to diffusion or welding processes between the coating and the workpiece material.

There exist several approaches to overcome the above-described problems.

In one approach, the cutting speed and cutting forces are maintained sufficiently low to keep the temperature at the cutting edge below a temperature limit of accelerated diffusion wear. However, slow cutting speeds are not desired for economic reasons, and even small variations of the workpiece material may change the cutting conditions in a way that diffusion wear still occurs.

In another approach, the temperature limit where accelerated diffusion wear occurs is increased by alloying ruthenium to the cobalt binder of the cemented carbide body of the tool. However, ruthenium is a quite expensive alloying element which increases the overall costs of the machining process. And, the increase of the temperature limit of accelerated diffusion wear by alloying ruthenium is not as high as it would be desired to achieve an economically feasible balance between increased cutting speed and the costs of the ruthenium alloyed cemented carbide.

In yet another approach, diffusion wear is lowered by strong cooling (cryogenic cooling) of the cutting area using liquid nitrogen or carbon dioxide. However, this method is complex and requires expensive equipment. Also, the strong cooling may have an undesired influence on the cutting performance and the properties of the workpiece material surface.

Recently, a coating layer of $TiB_2$ prepared by plasma-activated CVD (PA-CVD) was proposed as a diffusion barrier for the reduction of diffusion wear resulting in increased tool life in turning operations compared to uncoated and conventionally CVD coated cemented carbide tools. However, the temperature and the relatively long holding times in the PA-CVD process may result in undesired grain growth and embrittlement of the cemented carbide body of the tool. This is particularly disadvantageous for solid hard metal (SHM) tools that are preferably produced from fine-grained cemented carbides.

US 2016/175939 discloses a surface-coated tool for the machining of a "difficult-to-cut material" such as stainless steel, Inconel®, or a titanium alloy, the tool comprising a substrate and a coating film formed on said substrate, said coating film including a layer in which one or more A sub-layers and one or more B sub-layers are alternately stacked, said A sub-layer and said B sub-layer each having a thickness not smaller than 2 nm and not greater than 100 nm, an average composition of said A sub-layer being expressed as $Ti_aAl_bSi_cN$ ($0.5<a<0.8$, $0.2<b<0.4$, $0.01<c<0.1$, $a+b+c=1$), an average composition of said B sub-layer being expressed as $Ti_dAl_eSi_fN$ ($0.4<d<0.6$, $0.3<e<0.7$, $0.01<f<0.1$, $d+e+f=1$), and a condition of $0.05<a-d\leq0.2$ and $0.05<e-b\leq0.2$ being satisfied.

US 2016/193662 also discloses a surface-coated tool for the machining of a "difficult-to-cut material", the hard coating being formed on the surface of a base material and comprising a structure in which a first layer and a second layer are alternately laminated at least two times, wherein: the first layer is composed of a TiAl nitride having a composition of $Ti_{1-a}Al_a$ ($0.3\leq a\leq0.7$), and the second layer has a nanoscale multi-layered structure or a structure in which the nanoscale multi-layered structure is repeatedly laminated at least two times, the nanoscale multi-layered structure including a thin sub-layer A, a thin sub-layer B, a thin sub-layer C, and a thin sub-layer D having thicknesses of 3 nm to 20 nm, where: the thin sub-layer A is composed of an AlTiSi nitride having a composition of $Al_{1-b-c}Ti_bSi_c$ ($0.3\leq b\leq0.7$, $0\leq c\leq0.1$), the thin sub-layer B and the thin sub-layer D are composed of a TiAl nitride having a composition of $Ti_{1-d}Al_d$ ($0.3\leq d\leq0.7$), the thin sub-layer C is composed of a AlCr nitride having a composition of $Al_{1-e}Cr_e$ ($0.3\leq e\leq0.7$), the aluminum (Al) content in the thin sub-layer A differs from the aluminum content in the thin sub-layer B, and the nitrogen content in the first layer is greater than the nitrogen content in the second layer. The deposition of such coatings requires a great level of complexity in the coating process, and the applied arc ion plating process at very low nitrogen pressures leads to a high number of disadvantageous macro-particles (droplets) in the resulting coatings.

OBJECT OF THE INVENTION

Therefore, it is an object of the present invention to provide a coated metal cutting tool that overcomes the disadvantages of the prior art and is suitable for the machining of work piece material of the ISO-S group, particularly heat resistant super alloys (HRSA) and titanium, including titanium alloys, and exhibiting improved tool life, improved tribochemical properties at the cutting edge and particularly improved resistance against diffusion wear.

DESCRIPTION OF THE INVENTION

In order to overcome the above problems, the present invention provides a metal cutting tool comprising a main body made of cemented carbide, cermet, ceramic, steel or high-speed steel, and a multi-layer wear protection coating, wherein the wear protection coating comprises a lower layer (LL) having the overall composition $Ti_m Al_{(1-m)} N$ with $0.25<m<0.55$ and an overall thickness of the lower layer (LL) of from 500 nm to 3 µm,
wherein the lower layer (LL) consists of 50 to 600 pairs of alternately stacked sub-layers (A) and (B) with the sequence (A-B-A-B- . . . ),
the sub-layers (A) having the composition $Ti_a Al_{(1-a)} N$ with $0.45\leq a\leq0.55$ and a thickness of from 1 nm to 10 nm, wherein the first sub-layer in the layer stack of sub-layers (A) and (B) has a layer thickness of from 1 nm to 100 nm,
the sub-layers (B) having the composition $Ti_b Al_{(1-b)} N$ with $0.25\leq b\leq0.40$ and a thickness of from 1 nm to 10 nm,
and the sub-layers (A) and (B) having different stoichiometrical compositions with $(a-b)\geq0.10$
an upper layer (UL) being deposited immediately on the lower layer (LL) and having the overall composition $Ti_n Al_o Si_p N$ with $n+o+p=1$ and $0.30\leq n\leq0.50$, $0.40\leq o\leq0.60$ and $0.05\leq p\leq0.20$ and an overall thickness of the upper layer (UL) of from 500 nm to 3 µm,
wherein the upper layer (UL) consists of 30 to 400 triples of alternately stacked sub-layers (C), (D) and (E) with the sequence (C-D-E-C-D-E- . . . )
the sub-layers (C) of the upper layer (UL) being defined in the same way as the sub-layers (A) of the lower layer (LL), and the sub-layers (D) of the upper layer (UL) being defined in the same way as the sub-layers (B) of the lower layer (LL),
and the sub-layers (C) and (D) having different stoichiometrical compositions with $(a-b)\geq0.10$, and the sub-layers (E) having the composition $Ti_x Al_y Si_z N$ with $x+y+z=1$ and $0.20\leq x\leq0.45$, $0.20\leq y\leq0.45$ and $0.20\leq z\leq0.45$ and a thickness of from 1 nm to 10 nm.

Preferably, the multi-layer wear protection coating is applied on the main body by the PVD process, more preferably by cathodic arc vapor deposition (Arc-PVD).

As stated before, one of the challenges in machining of HRSA and titanium work piece materials using tools with geometrically defined cutting edge is the danger of adhesion of the workpiece material to the surface of the cutting tool leading to diffusion welding and/or other tribochemical reactions between the coating and the workpiece material. Investigations on worn cutting edges of tools used in titanium milling operations support the assumption that two processes are involved in the degradation and destruction of the tool. In one process the coating degrades from chemical reactions with the workpiece material. In another process small chips of the workpiece material weld to the coating, and afterwards these chips weld to larger portions of the workpiece material, i.e. to chips or even to the workpiece itself, and are ripped off the coating taking with them the portion of coating which they have been welded to before.

It has now surprisingly been found that the present invention is suitable to overcome these problems. And, it was even more surprising that the coatings of the present invention having the herein described composition and layer structure showed an even stronger adhesion of titanium and titanium alloy workpiece material to the coating. From this observed behavior one would rather expect an increased coating destruction by welding of the workpiece material to the coating and ripping off the coating in the turning operation. However, it has surprisingly been turned out that the coatings of the present invention, even though it shows a stronger adhesion to the workpiece material, leads to the formation of a stable layer of workpiece material on top of the coating protecting it from heat and diffusion processes at the cutting edge, thereby remarkably increasing the tool life compared to tools with prior art coatings.

Without being bound by theory, the inventors assume that the improved properties observed are due to the specific combination of layer composition, sequence and structure in the coating of the present invention. It seems that the adhesion of workpiece material to the coating is mainly due to the Si content in the sub-layers (E) of the upper layer (UL), and the combination with the Si free lower layer (LL) and the Si free sub-layers in the upper layer (UL) provide excellent wear protection due to improved hardness and abrasion resistance compared to prior art coatings previously known on tools for the machining of "difficult-to-cut material".

The above-described hypothesis is supported by FIB milling (Focused Ion Beam; on a Zeiss Crossbeam SEM with FIB column using Ga ions for milling) in worn cutting edges, showing cross-sections through the worn cutting edge. Herein, different phenomena in wear progress can be observed. The wear of tools having the coating of the present invention is clearly different from the wear seen on tools coated according to the prior art, such as disclosed in U.S. Pat. No. 9,476,114. On the cutting edge of the coated tool according to the present invention titanium smearing can be seen, but the crystalline structure and the composition of the Ti near coating and substrate is different from the composition and structure on the surface of the smear.

According to the present invention, the thickness of the sub-layers within the lower layer (LL) and the upper layer (UL) is within the range of 1 nm to 10 nm. Such thin layers of alternating compositions can be produced by periodically guiding the substrate past the different mixed targets in a PVD system. The thickness of the sub-layers within the lower layer (LL) and the upper layer (UL) can also be ≥2 nm, or ≥3 nm, or ≥4 nm. The thicknesses of the sub-layers can either be determined on a SEM of a cross-section of the coating, wherein sub-layers of alternatingly different compositions can be distinguished (like the annual rings of a tree), thus, the thickness of the sub-layers can be calculated from the total layer thickness divided by the number of visible sub-layers. Alternatively, the thickness of the sub-layers can be determined from the total layer thickness and the deposition conditions, i. e. how many times the substrate has passed the target from which the layer was deposited.

As outlined, the first sub-layer in the layer stack of sub-layers (A) and (B) in the lower layer (LL) may be deposited at a larger thickness than the remaining (subsequent) sub-layers, and the first sub-layer has a layer thickness of from 1 nm to 100 nm, preferably a thickness of 10 nm or more. Further, the first sub-layer in the layer stack of sub-layers (A) and (B) in the lower layer (LL) preferably is a sub-layer (A) having the composition $Ti_a Al_{(1-a)} N$ with $0.45 \leq a \leq 0.55$, or the first sub-layer in the layer stack is at least a sub-layer having an Al content of ≤0.65, preferably ≤0.60. For example, a $Ti_a Al_{1-a)} N$ layer with a= about 0.50 can be deposited from a commercially available Ti:Al target of about equal amounts of Ti and Al. The advantage of providing a first sub-layer (A) (also referred to as a starting sub-layer) of a thickness of about 10 nm or more and of the aforementioned composition is that this layer deposits with face-centered cubic (fcc) crystal structure, and it promotes and stabilizes the fcc crystal structure also in the subsequently deposited thin sub-layers (A) and (B).

In TiAlN layers of higher Al contents, as for example in sub-layers (B) of $Ti_b Al_{(1-b)} N$ with $0.25 \leq b \leq 0.40$, especially if b<0.35, i. e. the Al content is >0.65, there is a general tendency to form portions of hexagonal crystal structure, which is undesired due to deteriorating the hardness of the coating. However, it has turned out that the fcc crystal structure can be stabilized, even in TiAlN sub-layers of higher Al contents, if the deposition of the layer stack of sub-layers (A) and (B) of the lower layer is initiated by a first sub-layer having the fcc crystal structure of preferably >10 nm thickness and by stacking the sub-layers (B) of higher Al content between sub-layers (A) of lower Al content.

According to one preferred embodiment of the present invention the lower layer (LL) is deposited immediately on the surface of the main body (substrate). According to another embodiment of the present invention, the multi-layer coating comprises one or more further layers of hard material between the main body (substrate) and the lower layer (LL), wherein the one or more further layers of hard material contain one or more of the elements of the groups 4a, 5a and 6a of the Periodic System, Al, Si, and one or more of the non-metals N, C, O and B. For example, the layers of hard material may preferably consist of TiN, TiC, TiCN etc.

The multi-layer coating of the present invention may comprise one or more further layers of hard material on top of the upper layer (UL), wherein the one or more further layers of hard material contain one or more of the elements of the groups 4a, 5a and 6a of the Periodic System, Al, Si, and one or more of the non-metals N, C, O and B.

The main body of the metal cutting tool of the present invention may consist of cemented carbide, cermet, ceramic, steel or high-speed steel. However, it has been found that the cutting tool of the present invention exhibits improved properties and tool lifetimes in the machining of HRSA and titanium work piece materials if the main body (substrate) of the tool is made of cemented carbide. Particularly preferred is a main body of cemented carbide having a relatively high Co binder content in combination with a fine grained tungsten carbide (WC) phase. Thereby, the tool shows an advantageous combination of toughness and hardness and allows for the preparation of precise cutting edge geometry. Therefore, in a preferred embodiment of the present invention, the cemented carbide main body of the cutting tool contains from 6 to 20 wt-% of Co binder, or from 8 to 16 wt-% of Co binder, or from 10 to 14 wt-% of Co binder, or from 11 to 13 wt-% of Co binder. The average WC grain size is preferably in the range from 0.3 to 2.0 µm, or from 0.4 to 1.5 µm, or from 0.5 to 1.2 µm.

If the average WC grain size of the cemented carbide is too large, such as up to about 10 µm, as it is usual in many conventional cemented carbide tools, there is a high risk that WC grains are pulled out or broken away during cutting edge preparation or edge rounding, respectively, by grinding, especially if sharp cutting edges of radii in the order of about 5-10 µm are to be prepared. Therefore, sharper and more precise cutting edges can be prepared on cemented carbide main bodies having a fine grained average WC grain size. Furthermore, the fine grained WC grain size contributes to improved hardness of the cutting tool. However, at the same time, it is advantageous to adjust the Co binder content to achieve a good combination of toughness and hardness.

The tool according to the present invention may be a solid hard metal (SHM) tool or an indexable cutting insert. However, it has turned out that the inventive combination of the main body and the multi-layer coating according to the invention is particularly advantageous in solid hard metal (SHM) rotary cutting tools, especially in milling tools for the milling of materials of the ISO-S group of work piece materials, preferably heat resistant super alloys (HRSA), titanium, titanium alpha-alloys, titanium beta-alloys, titanium mixed alpha+beta-alloys, such as titanium mixed alpha+beta-alloys of the Ti-6Al-4V type.

Further features and advantages of the present invention will become apparent from the following description of non-limiting examples and embodiments of the present invention.

FIGURES

Figure 3:
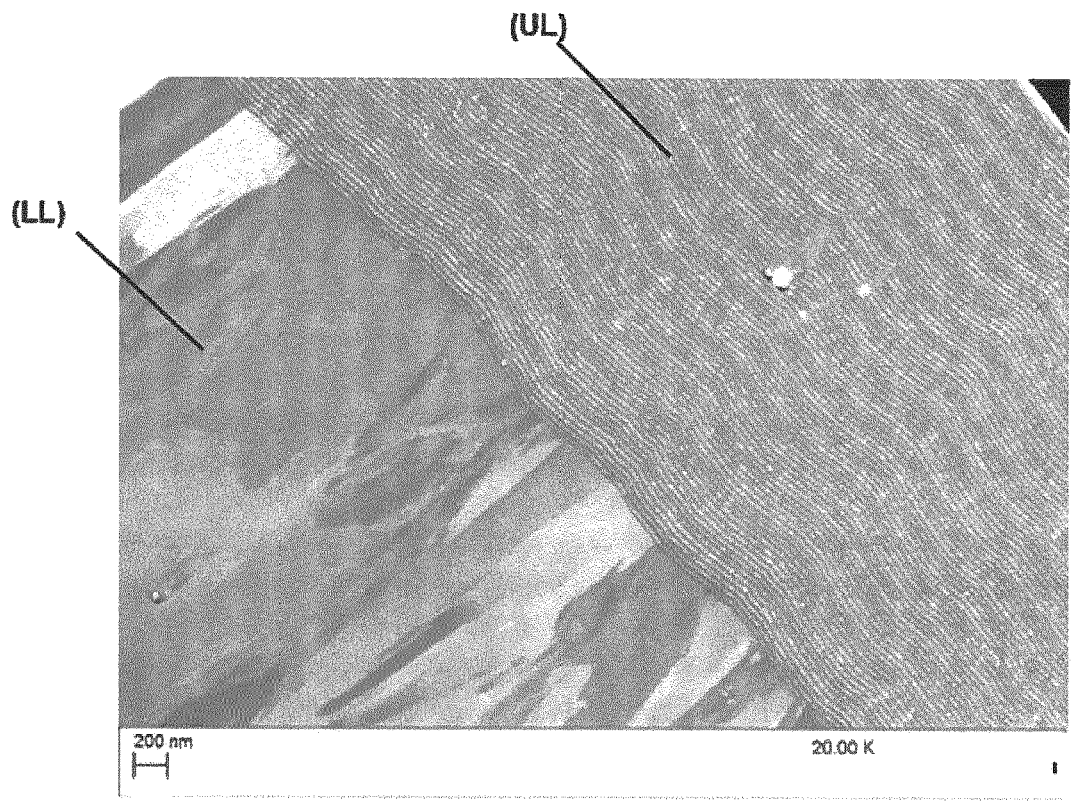

FIG. 3 shows a SEM of a cross-section of the inventive coating TSS3 with lower layer (LL) and upper layer (UL) at 20,000× magnification. In the upper layer (UL) the stacked sub-layers (C)-(D)-(E) can very well be seen, wherein the Si-containing sub-layers (E) appear darker than the sub-layers (C) and (D). In the lower layer (LL) a "columnar grain" like structure can be observed, whereby stacked nano sub-layers (A)-(B) are present within the individual grains. Since the sub-layers (A) and (B) both do not contain Si, such as sub-layer (E), the contrast between the sublayers (A) and (B) is very low, so that the stacked structure is difficult to see in the representation of FIG. 3.

Figure 4:
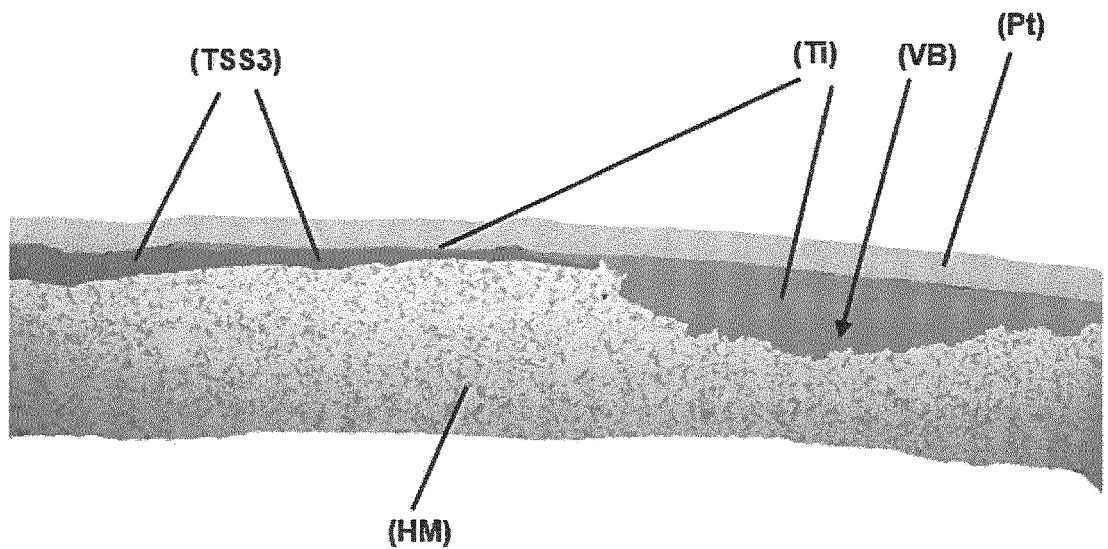

FIG. 4 shows a SEM of a cross-section of the inventive coating TSS3 after a cutting test on Ti alloy workpiece material at 1,610× magnification. (HM) designates the hard metal substrate material; (TSS3) designates the rest of the coating remained after the cutting test; (Ti) which is slightly brighter than (TSS3) in FIG. 4, is "titanium smear" from the workpiece material adhering to the tool, especially where flank wear (VB) occurred. The "titanium smear" fills up the regions where the coating was worn off by flank wear. (Pt) designates a platinum protection layer which is not part of the inventive cutting tool, but rather required for the SEM measurement.

MATERIALS AND METHODS

Electron Microprobe Microanalysis (EMPA)

The chemical compositions of the coatings were determined by electron microprobe microanalysis (EMPA) using a Supra 40VP (Carl Zeiss Microscopy GmbH, Jena, Germany) equipped with an Oxford INCA EDS and at an acceleration voltage of 12 kV and a measuring time of 30 sec per spot.

X-Ray Diffraction (XRD)

X-ray diffraction measurements were done on a PANalytical Empyrean X-ray diffractometer in GI (grazing incidence) mode applying an incidence angle of 1° using CuKα-radiation. The X-ray tube was run in point focus at 40 kV and 40 mA. A parallel beam optic using an X-ray mirror with a mask of 2 mm, a divergence aperture of ⅛°, and a Soller slit with a divergence of 0.04° was used on the primary side, whereby the irradiated area of the sample was defined in such manner that a spill-over of the X ray beam over the coated face of the sample is avoided. On the secondary side a parallel plate collimator with an acceptance angle of 0.18° was used together with a proportional counting detector. For the classification of XRD reflections, the JCPDS databases were used.

Hardness/Young's Modulus

The measurements of the hardness and the Young's modulus (reduced Young's modulus) were performed by the nanoindentation method on a Fischerscope® HM500 Picodentor (Helmut Fischer GmbH, Sindelfingen, Germany) applying the Oliver and Pharr evaluation algorithm, wherein a diamond test body according to Vickers was pressed into the layer and the force-path curve was recorded during the measurement (maximum load: 15 mN; load/unload time: 20 s; creep time: 5 s). From this curve hardness and (reduced) Young's modulus were calculated. It should be noted that the impression depth should not be more than 10% of the coating thickness, otherwise characteristics of the substrate can falsify the measurements.

Scanning Electron Microscopy (SEM)

The morphology of the coatings was studied by scanning electron microscopy (SEM) using a Supra 40 VP (Carl Zeiss Microscopy GmbH, Jena, Germany). Cross sections were characterized with the SE2 (Everhart-Thornley) Detector.

Focused Ion Beam (FIB) Milling

Cross-sections of the cutting edges of worn tools were prepared using a Zeiss Crossbeam 540 (Carl Zeiss Microscopy GmbH, Jena, Germany) with FIB column. Ga ions accelerated to 30 kV were used for the milling operations.

WC Grain Size Determination in Cemented Carbide

The average WC grain size of cemented carbide or cermet is determined from the value of magnetic coercivity. The relationship between coercivity and grain size of WC is described, e.g., in Roebuck et al., Measurement Good Practice No. 20, National Physical Laboratory, ISSN 1368-6550, November 1999, Revised February 2009, Section 3.4.3, pages 19-20. For the purposes of this application the WC grain size, "d", is determined according to formula (8) on page 20 in the above-mentioned literature: $K=(c_1+d_1 W_{Co})+(c_2+d_2 W_{Co})/d$. Re-arranging one gets:

$$d=(c_2+d_2 W_{Co})/(K-(c_1+d_1 W_{Co})),$$

wherein d=WC grain size of the cemented carbide body, K=coercivity of the cemented carbide body in kA/m, herein measured according to standard DIN IEC 60404-7, $W_{Co}$=wt % Co in the cemented carbide body, $c_1$=1.44, $c_2$=12.47, $d_1$=0.04, and $d_2$=-0.37.

EXAMPLE 1

Substrate:

The substrates used in this example 1 were solid hard metal (SHM) end mill cutters consisting of a base body of WC-12 wt-% Co with an average WC grain size of 0.5 μm and containing 1.4 wt-% Cr carbide. Two different cutter geometries were used, S1 and S2:

|  | Cutter Geometry | |
| --- | --- | --- |
|  | S1 | S2 |
| Diameter: | 16 mm | 10 mm |
| Number of cutting edges: | 6 | 4 |
| Length of cutting edges: | 200% of the diameter | 220% of the diameter |
| Corner radius | 4 mm | 1 mm |

Coatings

PVD coatings were prepared in a commercial arc evaporation system, Innova (Oerlikon Balzers) equipped with 6 cathodic arc sources. The variation in the Ti, Al and Si concentrations in the deposited coating layers was achieved by using different TiAl and TiAlSi mixed targets of different compositions in the PVD system, and the substrate was guided periodically past the different mixed targets by threefold rotation. Prior to the deposition the substrates were cleaned with an argon-ion etching process at an Ar pressure of 0.21 Pa at 170 V DC substrate bias for 30 min. The compositions of sub-layers A to E prepared in this example and the mixed target compositions used for their production were as follows:

| Sub-Layer Composition | Target Composition |
|---|---|
| A $Ti_{0.50}Al_{0.50}N$ | TiAl (50:50) |
| B $Ti_{0.33}Al_{0.67}N$ | TiAl (33:67) |
| C $Ti_{0.50}Al_{0.50}N$ | TiAl (50:50) |
| D $Ti_{0.33}Al_{0.67}N$ | TiAl (33:67) |
| E $Ti_{0.33}Al_{0.34}Si_{0.33}N$ | TiAlSi (33:34:33) |

To ensure that the coating grows only in the desired fcc crystal structure a first sub-layer (A) with a thickness of approximately 30 nm was deposited immediately on the substrate surface, followed by the subsequent coating layers. The coating conditions of the sub-layers were as follows, whereby the Arc current of the first sublayer (A) was 175 A instead of 200 A for the subsequent sub-layers (A).

Coating Conditions

| Sub-Layer | Bias [V] | $N_2$ Pressure [Pa] | Specific evaporator flow [A/cm$^2$] | Arc current [A] | Deposition Temp. [° C.] | Rotation Speed [rpm] |
|---|---|---|---|---|---|---|
| $1^{st}$ A | 60 | 4 | 0.9 | 175 | 550 | 1.5 |
| A | 60 | 4 | 1 | 200 | 550 | 1.5 |
| B | 60 | 4 | 0.6 | 120 | 550 | 1.5 |
| C | 80 | 4 | 1 | 200 | 550 | 1.5 |
| D | 80 | 4 | 0.6 | 120 | 550 | 1.5 |
| E | 80 | 4 | 0.8 | 160 | 550 | 1.5 |

The following coatings according to the invention were prepared on the cutter substrates Si and S2:

| | Lower Layer (LL) | | | Upper Layer (UL) | | |
|---|---|---|---|---|---|---|
| Coating | # Pairs (A-B) | Thicknesses A/B [nm] | Total Thickness [µm] | # Triplets (C-D-E) | Thicknesses C/D/E [nm] | Total Thickness [µm] |
| TSS1 | 300 | 3/5 | 2.4 | 200 | 3/5/5 | 2.6 |
| TSS2 | 300 | 5/3 | 2.4 | 200 | 5/3/5 | 2.6 |
| TSS3 | 150 | 9/7 | 2.4 | 100 | 9/7/8 | 2.4 |

The mechanical properties of the coatings (hardness and reduced Young's modulus) were measured as described above and were as follows:

| Tool | Hardness [HV 0.015] | reduced Young's modulus [GPa] |
|---|---|---|
| TSS1 | 2700 | 330 |
| TSS2 | 2700 | 330 |
| TSS3 | 2700 | 330 |

Comparative tools were based on the same SHM substrates (S1 and S2) as the inventive tools. The comparative tools were as follows:

| Coating | |
|---|---|
| COMP1 | uncoated substrate |
| COMP2 | multi-layer TiAlN arc PVD coating according to EP 2 880 199 (example 1) |
| COMP3 | multi-layer TiAlN - TiSiN arc PVD coating "Ionbond Hardcut" prepared by external coater |

Measurement of Tool Wear

The inventive tools and comparative tools were tested for tool wear in side milling tests. The tools used and the individual test parameters, as well as the results are described below for different cutting tests made.

Tool wear is defined as the change in shape of the cutting part of a tool from its original shape, resulting from the progressive loss of tool material during cutting. In the present case, flank wear (VB) was measured as the specified tool-life criterion to compare inventive tools and comparative tools. Flank wear is defined as the loss of tool material from the tool flanks during cutting which results in the progressive development of a flank wear land.

Flank wear measurement is carried out parallel to the surface of the wear land and in a direction perpendicular to the original cutting edge, e.g. the distance from the original cutting edge to that limit of the wear land which intersects the original flank. Although the flank wear land on a significant portion of the flank may be of uniform size, there will be variations in its value at other portions of the flanks depending on the tool profile and edge chipping. Values of flank wear measurements shall therefore be related to the area or position along the cutting edges at which the measurement is made.

Figure 1:
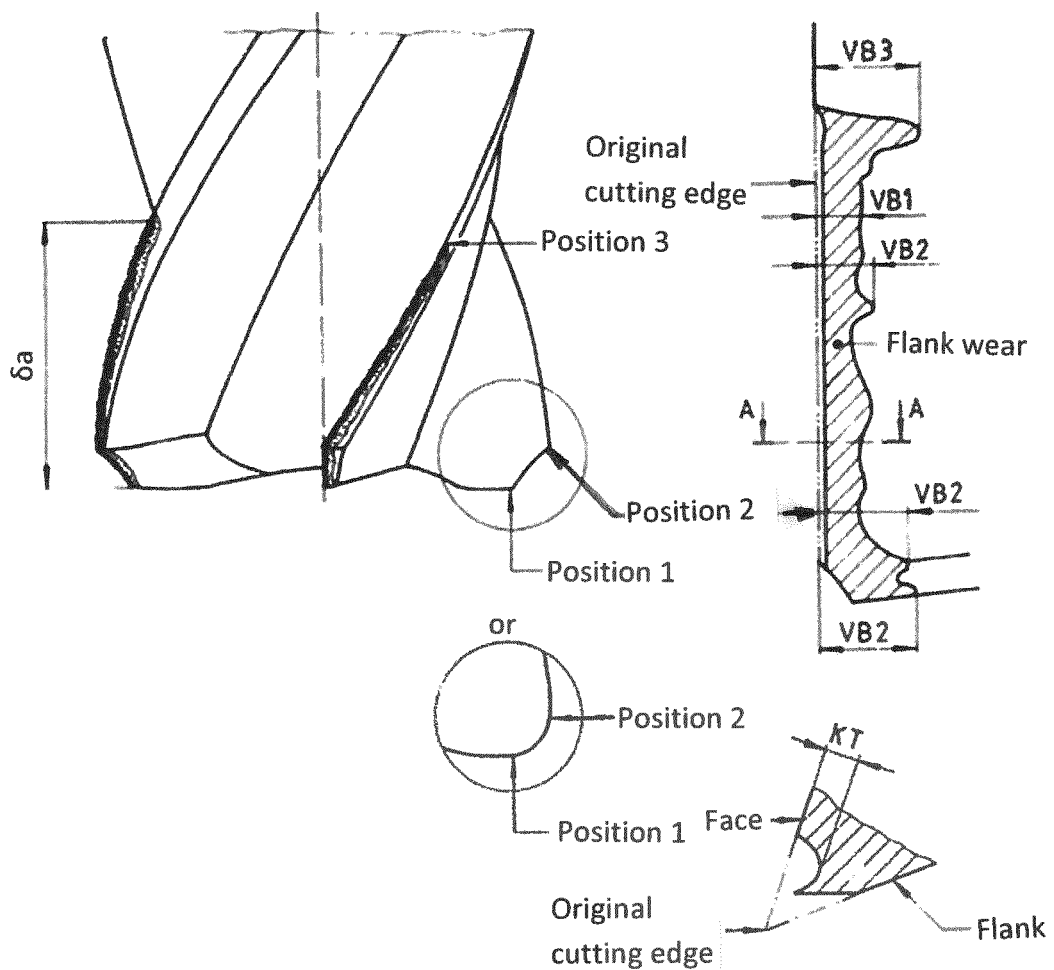
FIG. 1 illustrates wear types and positions on a typical end milling cutter. "δa" is the length of engagement of the cutter. "KT" is the depth of crater wear. "VB1", "VB2" and "VB3" represent different types of flank wear.
Figure 2:
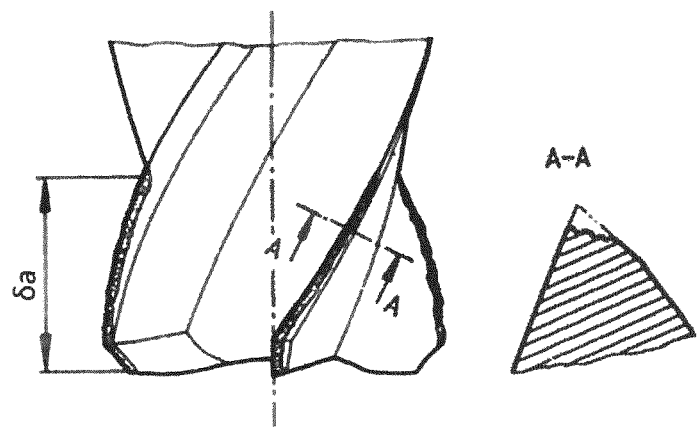
FIG. 2 illustrates the different types of flank wear, "(VB1) uniform flank wear", "(VB2) non-uniform flank wear" and "(VB3) localized flank wear". "δa" is the length of engagement of the cutter.
Figure 2:
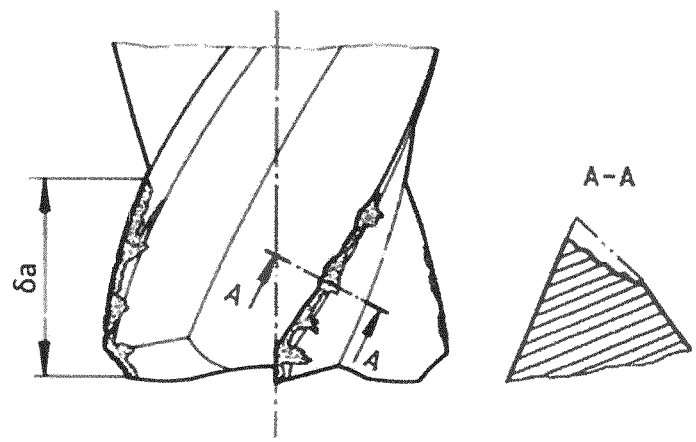
Figure 2:
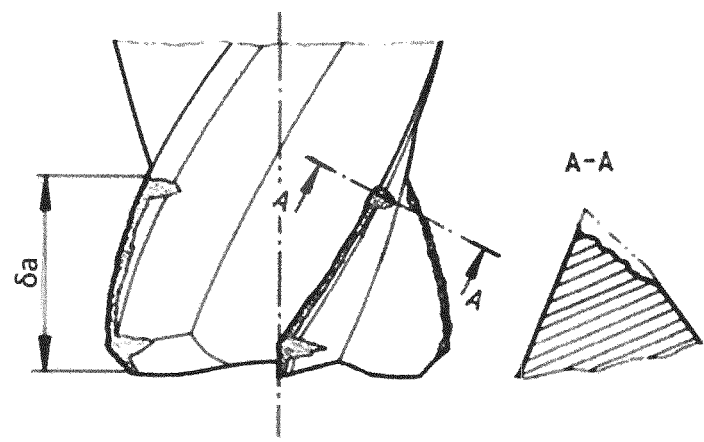

Flank wear measurement distinguishes between "uniform flank wear (VB1)", "non-uniform flank wear (VB2)" and "localized flank wear (VB3)" (see FIG. 2). In "uniform flank wear (VB1)" the wear land is normally of constant width and extends over those portions of the tool flanks adjoining the entire length of the active cutting edge. In "non-uniform flank wear (VB2)" the wear land has an irregular width and the profile generated by the intersection of the wear land and the original flank varies at each position of measurement. "Localized flank wear (VB3)" is an exaggerated and localized form of flank wear which develops at a specific part of the flank, shown in FIG. 1 at positions 1, 2 and 3. Positions 1 and 2 are on the flank of the radius (herein also referred to as "Corner") at the end of the tool, whereas position 3 is essentially at the opposite end of the cutting edge at the depth of cut ("DOC"). Localized flank wear (VB3) at the depth of cut (position 3) is sometimes also referred to as notch wear.

In the cutting tests herein, localized flank wear (VB3) was measured at the "Corner" (positions 1 and 2), as well as at the "DOC" (position 3), since flank wear was highest at these positions. "$VB3_{average}$" means the average of all measured VB3 values (at the specified position) of all cutting edges of a tool (e. g.: S1=6 cutting edges; S2=4 cutting edges) and from the three cutting tests carried out with each type of tool (coating). "$VB3_{max}$" is the highest VB3 value of all measured VB3 values (at the specified position) of all cutting edges of a tool and of the three cutting tests carried out with each type of tool (coating).

Cutting Test 1:

Inventive tools and comparative tools, each based on cutter geometry S1, were tested in side milling tests, and the localized flank wear was measured. The cutting conditions are summarized in the following table.

Cutting Conditions (Cutting Test 1):

| | |
|---|---|
| Tooth Feed $f_z$ [mm/tooth] | 0.08 |
| Cutting speed $v_c$ [m/min] | 135 |
| Cutting width $a_e$ [mm] | 1.6 (0.1 × tool diameter) |
| Cutting depth $a_p$ [mm] | 8.5 |
| Metal Removing Rate [cm$^3$/min] | 17.53 |

-continued

| Cooling | water-in-oil emulsion with 9% oil (Blasocut B25) through internal channels and external nozzles |
|---|---|
| Stop Criteria (no. of passes) | 160 passes or VB3 ≥ 0.2 mm |
| Workpiece Material | Ti-6Al-4V (170 mm × 170 mm × 100 mm; tensile strength: 950 N/mm$^2$ |

Machining was stopped after the predefined number of passes or at an average localized flank wear of VB3≥0.2 mm at the corner The following table shows a conversion between "number of cutting cycles", "time in cut", "distance" and "no. of passes":

| No of cutting cycles | 5833 | 7583 | 9333 | 11083 |
|---|---|---|---|---|
| Time in cut [min] | 13.06 | 16.94 | 20.85 | 24.76 |
| Cutting length [m] | 16.80 | 21.84 | 26.88 | 31.92 |
| Passes | 100 | 130 | 160 | 190 |

In this test the wear maximum was observed at the cutting edge radius ("Corner"; positions 1 and 2), therefore, the values measured there were taken into account. The results are shown in the following table.

Results (Cutting Test 1):

| Coating | No. of Passes | VB3$_{average}$ Corner [mm] | VB3$_{max}$ Corner [mm] |
|---|---|---|---|
| TSS1 | 160 | 0.16 | 0.26 |
| TSS2 | 160 | 0.18 | 0.37 |
| TSS3 | 160 | 0.13 | 0.20 |
| COMP1 | 160 | 0.24 | 0.37 |
| COMP2 | 160 | 0.15 | 0.21 |
| COMP3 | 160 | 0.18 | 0.24 |

Cutting Test 2:

Inventive tools and comparative tools, each based on cutter geometry S2, were tested in side milling tests, and the localized flank wear was measured. The cutting conditions are summarized in the following table.

Cutting Conditions (Cutting Test 2):

| Tooth Feed f$_z$ [mm/tooth] | 0.04 |
|---|---|
| Cutting speed v$_c$ [m/min] | 100 |
| Cutting width a$_e$ [mm] | 2 (0.2 × tool diameter) |
| Cutting depth a$_p$ [mm] | 2.5 |
| Cooling | water-in-oil emulsion with 9% oil (Blasocut B25) through internal channels and external nozzles |
| Stop Criteria (no. of passes) | Test was stopped when the second best tool had VB3 ≥ 0.2 mm |
| Workpiece Material | Ti-6Al-4V (175 mm × 175 mm × 50 mm; tensile strength: 950 N/mm$^2$ |

The following table shows a conversion between "number of cutting cycles", "time in cut", "distance" and "no. of passes":

| Time in cut [min] | 34.36 | 48.11 | 54.98 | 79.03 |
|---|---|---|---|---|
| Cutting length [m] | 17.5 | 24.5 | 28 | 40.25 |
| Passes | 100 | 140 | 160 | 230 |

Results (Cutting Test 2):

| Coating | No. of Passes | VB3$_{average}$ Corner [mm] | VB3$_{max}$ Corner [mm] | VB3$_{average}$ DOC [mm] | VB3$_{max}$ DOC [mm] |
|---|---|---|---|---|---|
| TSS1 | 160 | 0.020 | 0.027 | 0.032 | 0.035 |
| COMP2 | 160 | 0.051 | 0.086 | 0.228 | 0.295 |
| TSS1 | 230 | 0.052 | 0.059 | 0.051 | 0.060 |
| COMP2 | 230 | --- | --- | --- | --- |

"---": stop criterion was reached

It could be seen that the wear of the tool coated with the coating according to the invention shows a very even wear at the corner (positions 1 and 2) and at the DOC (position 3), so the test was run until the tool coated with TSS1 was the only remaining tool in the test. The comparative tool showed a much higher wear at the DOC (position 3) than at the corner (positions 1 and 2) at 160 passes, and 230 passes were not reached (stop criterion reached).

Cutting Test 3:

The inventive tools and comparative tools, each based on cutter geometry S2, were tested in side milling tests, and the localized flank wear was measured. The cutting conditions are summarized in the following table.

Cutting Conditions (Cutting Test 3):

| Tooth Feed f$_z$ [mm/tooth] | 0.11 |
|---|---|
| Cutting speed v$_c$ [m/min] | 130 |
| Cutting width a$_e$ [mm] | 1 (0.1 × tool diameter) |
| Cutting depth a$_p$ [mm] | 2.5 |
| Cooling | water-in-oil emulsion with 9 % oil (Blasocut B25) through internal channels and external nozzles |
| Stop Criteria (no. of passes) | 120 passes or VB3 0.2 mm |
| Workpiece Material | Ti-6Al-4V (175mm × 175mm × 50mm; tensile strength: 950 N/mm$^2$ |

Results (Cutting Test 3):

| Coating | No. of Passes | VB3$_{average}$ Corner [mm] | VB3$_{max}$ Corner [mm] | VB3$_{average}$ DOC [mm] | VB3$_{max}$ DOC [mm] |
|---|---|---|---|---|---|
| TSS1 | 120 | 0.057 | 0.100 | 0.143 | 0.193 |
| COMP2 | 120 | 0.056 | 0.144 | 0.162 | 0.307 |

The machining conditions in cutting test 3 are rather demanding, therefore, the tools were worn after a comparatively low number of passes.

Cutting Test 4:

The inventive tools and comparative tools, each based on cutter geometry S2, were tested in side milling tests, and the localized flank wear was measured. The cutting conditions are summarized in the following table.

Cutting Conditions (Cutting Test 4):

| Tooth Feed $f_z$ [mm/tooth] | 0.04 |
|---|---|
| Cutting speed $v_c$ [m/min] | 100 |
| Cutting width $a_e$ [mm] | 2 (0.2 × tool diameter) |
| Cutting depth $a_p$ [mm] | 2.5 |
| Cooling | water-in-oil emulsion with 9% oil (Blasocut B25) through internal channels and external nozzles |
| Stop Criteria (no. of passes) | 200 passes or VB3 ≥ 0.2 mm |
| Workpiece Material | Ti-6Al-4V (175 mm × 175 mm × 50 mm; tensile strength: 950 N/mm²) |

Results (Cutting Test 4):

| Coating | No. of Passes | VB3$_{average}$ Corner [mm] | VB3$_{max}$ Corner [mm] | VB3$_{average}$ DOC [mm] | VB3$_{max}$ DOC [mm] |
|---|---|---|---|---|---|
| TSS1 | 120 | 0.026 | 0.030 | 0.033 | 0.038 |
| COMP1 | 120 | 0.030 | 0.049 | 0.031 | 0.039 |
| COMP2 | 120 | 0.032 | 0.042 | 0.038 | 0.053 |
| TSS1 | 200 | 0.063 | 0.114 | 0.060 | 0.114 |
| COMP1 | 200 | 0.052 | 0.108 | 0.057 | 0.165 |
| COMP2 | 200 | 0.076 | 0.195 | 0.066 | 0.178 |

In this test uncoated tools (COMP1) were also tested, since uncoated tools are still in use in this field, because in some applications in titanium machining no benefits due to coatings have been observed, and in the field of end mills the reconditioning of tools is much easier and faster when the tools are used uncoated. The test was stopped before end of tool life.

The invention claimed is:

1. A metal cutting tool comprising:
a main body made of cemented carbide, cermet, ceramic, steel or high-speed steel; and
a multi-layer wear protection coating, wherein the wear protection coating comprises:
a lower layer having an overall composition $Ti_m Al_{(1-m)} N$ with 0.25<m<0.55, and an overall thickness of the lower layer being of from 500 nm to 3 μm, wherein the lower layer includes 50 to 600 pairs of alternately stacked sub-layers (A) and (B) having a sequence (A-B-A-B- . . . ), the stacked sub-layers (A) having a composition $Ti_a Al_{(1-a)} N$ with 0.45≤a≤0.55 and a thickness of from 1 nm to 10 nm, wherein the first sub-layer (A) in the layer stack of sub-layers (A) and (B) has a layer thickness of at least 5 nm, the stacked sub-layers (B) having a composition $Ti_b Al_{(1-b)} N$ with 0.25≤b≤0.40 and a thickness of from 1 nm to 10 nm, and the stacked sub-layers (A) and (B) having different stoichiometrical compositions with (a-b)≥0.10; and
an upper layer deposited immediately on the lower layer and having an overall composition $Ti_n Al_o Si_p N$ with n+o+p=1 and 0.30≤n≤0.50, 0.40≤o≤0.60 and 0.05≤p≤0.20, and an overall thickness of the upper layer being of from 500 nm to 3 μm, wherein the upper layer includes 30 to 400 triples of alternately stacked sub-layers (C), (D) and (E) having a sequence (C-D-E-C-D-E- . . . ), the sub-layers (C) of the upper layer being defined in the same way as the sub-layers (A) of the lower layer, and the sub-layers (D) of the upper layer being defined in the same way as the sub-layers (B) of the lower layer, and the sub-layers (C) and (D) of the upper layer having different stoichiometrical compositions with (a-b)≥0.10, and the sub-layers (E) of the upper layer having a composition $Ti_x Al_y Si_z N$ with x+y+z=1 and 0.20≤x≤0.45, 0.20≤y≤0.45 and 0.20≤z≤0.45 and a thickness of from 1 nm to 10 nm.

2. The tool according to claim 1, wherein the multi-layer wear protection coating is applied on the main body by a PVD process, more preferably by cathodic arc vapor deposition.

3. The tool according to claim 1, further comprising one or more further layers of hard material disposed on top of the upper layer and/or between the main body and the lower layer, the one or more further layers of hard material containing one or more of the elements of the groups 4a, 5a and 6a of the Periodic System, Al, Si and one or more of the non-metals N, C, O and B.

4. The tool according to claim 1, wherein the lower layer is deposited immediately on a surface of the main body.

5. The tool according to claim 1, wherein the main body is made of cemented carbide.

6. The tool according to claim 5, wherein the cemented carbide contains from 6 to 20 wt-% of Co binder, or from 8 to 16 wt-% of Co binder, or from 10 to 14 wt-% of Co binder, or from 11 to 13 wt-% of Co binder.

7. The tool according to claim 5, wherein the cemented carbide has an average WC grain size of from 0.3 to 2.0 μm, or from 0.4 to 1.5 μm, or from 0.5 to 1.2 μm.

8. The tool according to claim 1, wherein the tool is a solid hard metal rotary cutting tool.

9. A method of using a tool comprising:
providing a tool according to claim 1;
milling steel of the ISO-S group of work piece materials, such as heat resistant super alloys, titanium, titanium alpha-alloys, titanium beta-alloys, titanium mixed alpha+beta-alloys, and titanium mixed alpha+beta-alloys of the Ti-6Al-4V type, with the tool.

10. The tool according to claim 1, wherein the multi-layer wear protection coating is applied on the main body by cathodic arc vapor deposition.

11. The tool according to claim 1, wherein the tool is a milling tool.

* * * * *